United States Patent
Yoon et al.

(10) Patent No.: US 7,974,147 B2
(45) Date of Patent: Jul. 5, 2011

(54) METHOD AND APPARATUS FOR MONITORING MEMORY ADDRESSES

(75) Inventors: Yung Sup Yoon, Seoul (KR); Kook Pyo Lee, Incheon (KR)

(73) Assignee: Inha-Industry Partnership Institute, Incheon (KR)

( * ) Notice: Subject to any disclaimer, the term of this patent is extended or adjusted under 35 U.S.C. 154(b) by 400 days.

(21) Appl. No.: 12/344,523

(22) Filed: Dec. 28, 2008

(65) Prior Publication Data

US 2009/0213680 A1    Aug. 27, 2009

(30) Foreign Application Priority Data

Feb. 22, 2008   (KR) .................. 10-2008-0016135

(51) Int. Cl.
    *G11C 8/00* (2006.01)
(52) U.S. Cl. .................. 365/230.06; 365/230.08
(58) Field of Classification Search .............. 365/230.06, 365/230.08; 714/724; 712/32
    See application file for complete search history.

(56) References Cited

U.S. PATENT DOCUMENTS 5,784,291 A * 7/1998 Chen et al. .......... 712/32
6,119,254 A * 9/2000 Assouad et al. ......... 714/724

OTHER PUBLICATIONS

CMOS SDRAM Device Operation, Samsung, Jul. 2006.
CMOS SDRAM Timing Diagram, Samsung, Feb. 2004.

\* cited by examiner

*Primary Examiner* — Vu A Le
(74) *Attorney, Agent, or Firm* — Edwards Angell Palmer & Dodge LLP; Peter C. Lauro, Esq.; Kongsik Kim, Esq.

(57) ABSTRACT

Disclosed herein is a method and apparatus for monitoring a memory address transmitted along an address path and converted into a row or column address of memory. The method includes: generating a path decision signal for deciding whether to connect the address path to a data terminal of the memory according to a memory command; and when the address path is connected to the data terminal of the memory in response to the path decision signal, transmitting a memory address, corresponding to the memory command, to the data terminal of the memory so that the memory address is monitored through the data terminal of the memory.

16 Claims, 11 Drawing Sheets

FIG. 1

| SDRAM Technology | | Column Address (AddrOut[ ]) | | | | | | | | | | | | | | |
|---|---|---|---|---|---|---|---|---|---|---|---|---|---|---|---|---|
| | | 14 | 13 | 12 | 11 | 10 | 9 | 8 | 7 | 6 | 5 | 4 | 3 | 2 | 1 | 0 |
| 16M-bit | 2Mx8 | · | 21 | · | · | AP | · | 22 | 9 | 8 | 7 | 6 | 5 | 4 | 3 | 2 |
| | 1Mx16 | · | 21 | · | · | · | · | · | 9 | 8 | 7 | 6 | 5 | 4 | 3 | 2 |
| 64M-bit | 8Mx8 | 22 | 21 | · | · | · | · | 24 | 9 | 8 | 7 | 6 | 5 | 4 | 3 | 2 |
| | 4Mx16 | 22 | 21 | · | · | · | · | · | 9 | 8 | 7 | 6 | 5 | 4 | 3 | 2 |
| | 2Mx32 | 22 | 21 | · | · | · | · | · | 9 | 8 | 7 | 6 | 5 | 4 | 3 | 2 |
| 128M-bit | 16Mx8 | 22 | 21 | · | · | 25 | · | 24 | 9 | 8 | 7 | 6 | 5 | 4 | 3 | 2 |
| | 8Mx16 | 22 | 21 | · | · | · | · | 24 | 9 | 8 | 7 | 6 | 5 | 4 | 3 | 2 |
| | 4Mx32 | 22 | 21 | · | · | · | · | · | 9 | 8 | 7 | 6 | 5 | 4 | 3 | 2 |
| 256M-bit | 32Mx8 | 22 | 21 | · | · | 26 | · | 25 | 9 | 8 | 7 | 6 | 5 | 4 | 3 | 2 |
| | 16Mx16 | 22 | 21 | · | · | · | · | 25 | 9 | 8 | 7 | 6 | 5 | 4 | 3 | 2 |
| | 8Mx32 | 22 | 21 | · | · | · | · | · | 9 | 8 | 7 | 6 | 5 | 4 | 3 | 2 |

| SDRAM Technology | | Row Address (AddrOut[ ]) | | | | | | | | | | | | | | |
|---|---|---|---|---|---|---|---|---|---|---|---|---|---|---|---|---|
| | | 14 | 13 | 12 | 11 | 10 | 9 | 8 | 7 | 6 | 5 | 4 | 3 | 2 | 1 | 0 |
| 16M-bit | 2Mx8 | · | 21 | · | · | 20 | 19 | 18 | 17 | 16 | 15 | 14 | 13 | 12 | 11 | 10 |
| | 1Mx16 | · | 21 | · | · | 20 | 19 | 18 | 17 | 16 | 15 | 14 | 13 | 12 | 11 | 10 |
| 64M-bit | 8Mx8 | 22 | 21 | · | 23 | 20 | 19 | 18 | 17 | 16 | 15 | 14 | 13 | 12 | 11 | 10 |
| | 4Mx16 | 22 | 21 | · | 23 | 20 | 19 | 18 | 17 | 16 | 15 | 14 | 13 | 12 | 11 | 10 |
| | 2Mx32 | 22 | 21 | · | · | 20 | 19 | 18 | 17 | 16 | 15 | 14 | 13 | 12 | 11 | 10 |
| 128M-bit | 16Mx8 | 22 | 21 | · | 23 | 20 | 19 | 18 | 17 | 16 | 15 | 14 | 13 | 12 | 11 | 10 |
| | 8Mx16 | 22 | 21 | · | 23 | 20 | 19 | 18 | 17 | 16 | 15 | 14 | 13 | 12 | 11 | 10 |
| | 4Mx32 | 22 | 21 | · | 23 | 20 | 19 | 18 | 17 | 16 | 15 | 14 | 13 | 12 | 11 | 10 |
| 256M-bit | 32Mx8 | 22 | 21 | 24 | 23 | 20 | 19 | 18 | 17 | 16 | 15 | 14 | 13 | 12 | 11 | 10 |
| | 16Mx16 | 22 | 21 | 24 | 23 | 20 | 19 | 18 | 17 | 16 | 15 | 14 | 13 | 12 | 11 | 10 |
| | 8Mx32 | 22 | 21 | 24 | 23 | 20 | 19 | 18 | 17 | 16 | 15 | 14 | 13 | 12 | 11 | 10 |

METHOD AND APPARATUS FOR MONITORING MEMORY ADDRESSES

CROSS-REFERENCE TO RELATED APPLICATION

This application claims under 35 U.S.C. §119(a) the benefit of Korean Patent Application No. 10-2008-0016135 filed Feb. 22, 2008, the entire contents of which are incorporated herein by reference.

BACKGROUND

1. Technical Field

The present invention relates generally to a method and apparatus for monitoring memory addresses, and, more particularly, to a method and apparatus for monitoring memory addresses through a data terminal of memory.

2. Related Art

In general, with regard to the addresses of Synchronous DRAM (SDRAM), a Micro Controller Unit (MCU) converts memory addresses into row and column addresses in order to reduce the number of pins to the highest degree and minimize power consumption.

FIG. 1 is a diagram showing a mapping relationship between the memory and row addresses of a conventional SDRAM and a mapping relationship between the memory and column addresses thereof.

In order to perform write and read operations in association with SDRAM, an MCU converts corresponding memory addresses 106 and 108 into a row address 104 and a column address 102, transmits the row address 104 to memory (not shown), and then transmits the column address 102 to the memory.

Here, the memory addresses 106 and 108 are the actual addresses of data that are required by the MCU, and the row address 104 and the column address 102 are addresses into which the memory addresses 106 and 108 are converted in order to perform write and read operations in association with the SDRAM.

FIG. 2 is a timing diagram when a write command is executed in a conventional SDRAM.

As shown in this drawing, an address ADDR of SDRAM is input with it being divided into a row address RAS_ADDR1 and column addresses CAS_ADDR1 and CAS_ADDR2. When an nRAS signal is at a low voltage level, the row address is reflected, and, when an nCAS signal is at a low voltage level, the column address is reflected. Here, the data pin (DQ pin) of the SDRAM is a port through which actual data is transferred, and nDQM is a signal that determines the operating range of a DQ signal. A one-cycle data write operation is performed during interval '1' (202 of FIG. 2), and a four-cycle data write operation is performed during interval '2' (204 of FIG. 2). Here, one cycle refers to one memory clock.

Furthermore, when the nCAS signal is at a low voltage level and an nWE signal is at a low voltage level, a write operation is performed, and, when the nWE signal is at a high voltage level, a read operation is performed. That is, a write memory command or a read memory command is performed. Consequently, in FIG. 2, the row address RAS_ADDR1 is commonly used, an opration of writing data D1 is performed using the column address CAS_ADDR1, and consecutive operations of writing data D2, D3, D4 and D5 are performed using the column address CAS_ADDR2 after three cycles.

FIG. 3 is a timing diagram when a read command is executed in the conventional SDRAM.

Referring to FIG. 3, when an nCAS signal is at a low voltage level and an nWE signal is at a high voltage level, a read command is executed. In the case where CAS Latency (CL) is set to 2, read data D1 is generated after two cycles. In the case where the CL is set to 3, read data D2, D3, D4 and D5 are generated after three cycles. Consequently, in FIG. 3, a row address RAS_ADDR1 is commonly used, an operation of reading data D1 is performed using a column address CAS_ADDR1, and operations of reading data D2, D3, D4 and D5 are performed using a column address CAS_ADDR2 after three cycles.

However, since the write and read operations shown in FIGS. 2 and 3 are performed by applying the row address and the column addresses to the address pin of the SDRAN, there is a problem in that it is difficult for a user of SDRAM to find actual memory addresses that are used by an MCU in write and read operations.

Furthermore, in order to find actual memory addresses used by an MCU or a data flow from the outside of a chip, SDRAM signals are required to be directly monitored using a logic analyzer, an oscilloscope, or the like. There is difficulty in finding actual addresses because row or column addresses are measured instead of actual memory addresses. Accordingly, there is a problem in that a measurement pin must be further provided in order to directly monitor actual memory addresses.

The above information disclosed in this Background section is only for enhancement of understanding of the background of the invention and therefore it may contain information that does not form the prior art that is already known in this country to a person of ordinary skill in the art.

SUMMARY

Accordingly, the present invention has been made keeping in mind the above problems occurring in the prior art, and an object of the present invention is to provide a method and apparatus for monitoring memory addresses, which enables actual memory addresses, used by an MCU, to appear externally so that the addresses can be measured.

Another object of the present invention is to provide a method and apparatus for monitoring memory addresses, which is capable of monitoring memory addresses even though a pin for measuring the memory addresses is not further provided.

In one aspect, the present invention provides a method of monitoring memory addresses, each of the memory addresses being transmitted along an address path and being converted into a row or column address of memory, the method including the steps of: generating a path decision signal for deciding whether to connect the address path to a data terminal of the memory according to a memory command; and, when the address path is connected to the data terminal of the memory in response to the path decision signal, transmitting a memory address, corresponding to the memory command, to the data terminal of the memory so that the memory address is monitored through the data terminal of the memory.

In another aspect, the present invention provides an apparatus for monitoring memory addresses, each of the memory addresses being transmitted along an address path and being converted into a row or column address of memory, the apparatus including: a path decision signal generation unit for generating a path decision signal for deciding whether to connect the address path to a data terminal of the memory according to a memory command; and a path conversion unit for connecting the address path to the data terminal of the memory in response to the path decision signal, and transmitting a memory address, corresponding to the memory command, to the data terminal of the memory so that the memory address is monitored through the data terminal of the memory.

The above and other aspects of the invention will be discussed in detail infra.

BREIF DESCRIPTION OF THE DRAWINGS

The above and other objects, features and advantages of the present invention will be more clearly understood from the following detailed description taken in conjunction with the accompanying drawings, in which:

FIG. 1 is a diagram showing a mapping relationship between the memory and row addresses of a conventional SDRAM and a mapping relationship between the memory and column addresses of the general SDRAM;

DETAILED DESCRIPTION

Figure 2:
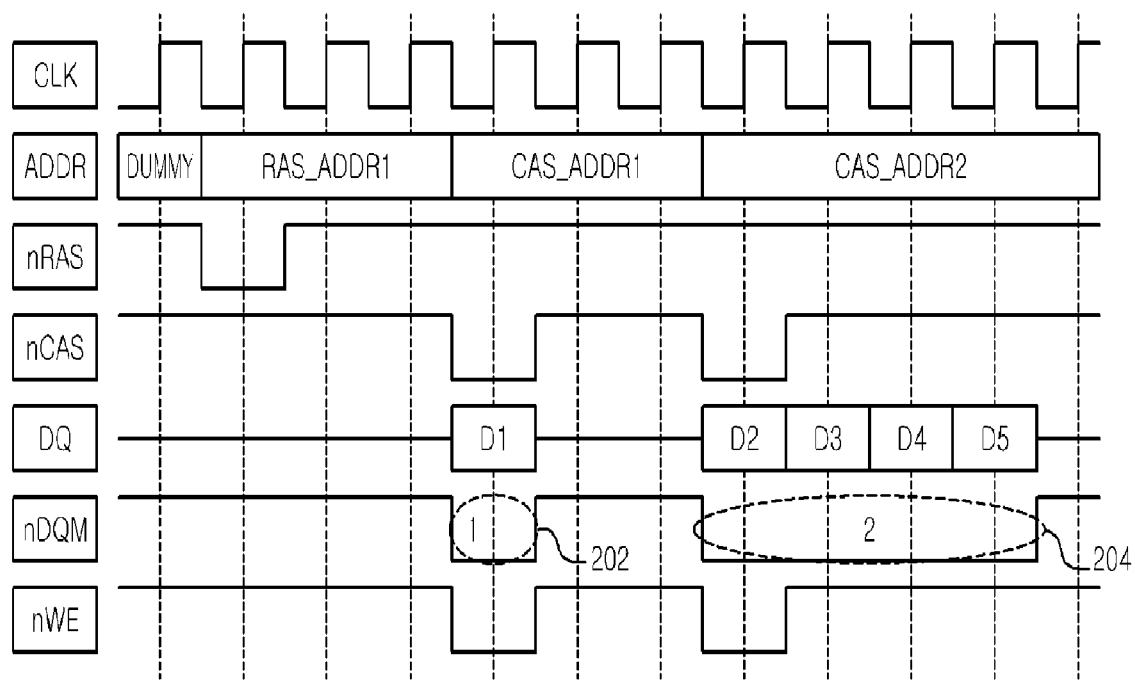
FIG. 2 is a timing diagram when a write command is executed in a conventional SDRAM.
Figure 3:
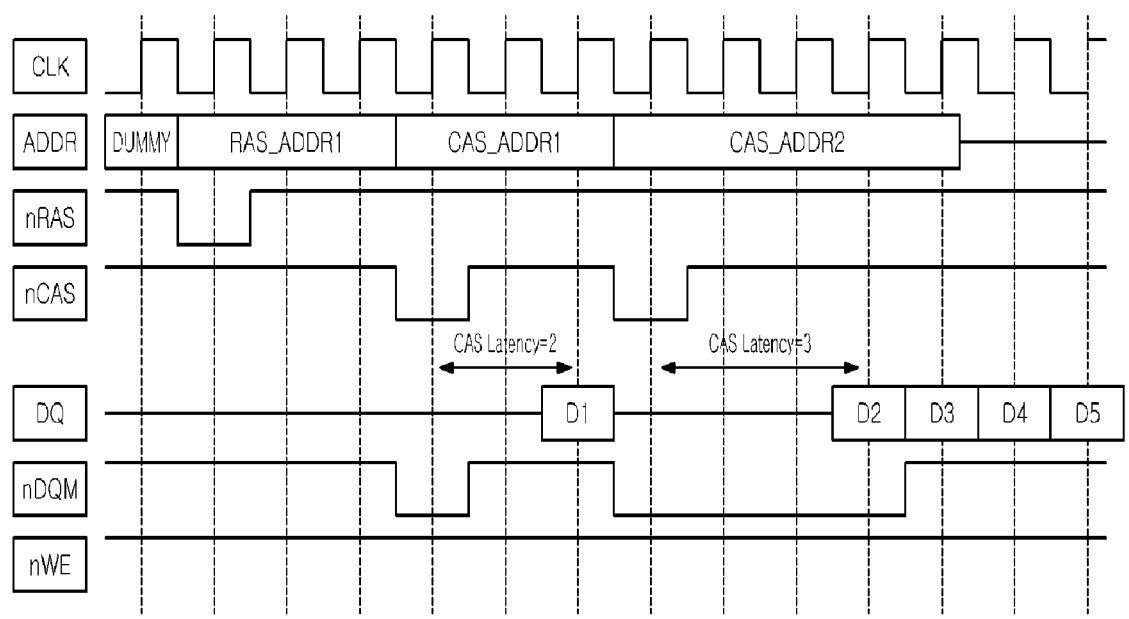
FIG. 3 is a timing diagram when a read command is executed in the conventional SDRAM.

Reference now should be made to the drawings, in which the same reference numerals are used throughout the different drawings to designate the same or similar components.

Figure 4:
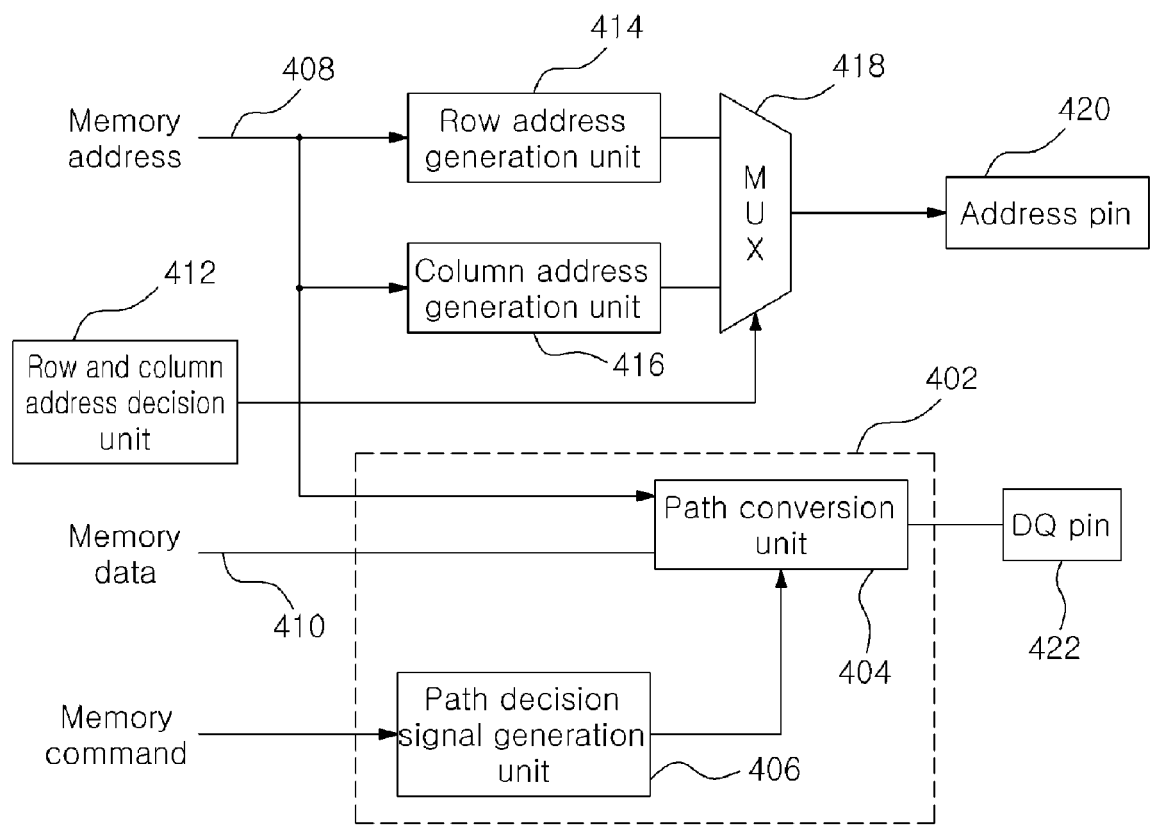
FIG. 4 is a block diagram showing an apparatus for monitoring memory addresses and its peripheral devices according to an embodiment of the present invention.

FIG. 4 is a block diagram showing an apparatus 402 for monitoring memory addresses and its peripheral devices according to an embodiment of the present invention.

As shown in this drawing, the apparatus 402 for monitoring memory addresses according to the embodiment of the present invention includes a path conversion unit 404 and a path decision signal generation unit 406. Memory addresses are transmitted to a DQ pin 422 during a specific time interval so that actual memory addresses used by an MCU can be monitored through the DQ pin 422, that is, a data terminal of memory.

A process of transmitting memory addresses and memory data through a row and column address decision unit 412, a row address generation unit 414, a column address generation unit 416, and a multiplexer (MUX) 418 of the apparatus 402 for monitoring memory addresses is described below. A memory address is transmitted to the row address generation unit 414 and the column address generation unit 416 along an address path 408. A row address and a column address generated by the row address generation unit 414 and the column address generation unit 416, respectively, are transmitted to the MUX 418.

The row and column address decision unit 412 transmits a signal for selecting a row or column address to the MUX 418 at an appropriate time in response to a memory command such as a write or read command. The MUX 418 outputs the signal to an address pin 420 of memory (not shown).

The memory data is transmitted to the apparatus 402 for monitoring memory addresses along a data path 410, and is output to the DQ pin 422 of the memory at an appropriate time in response to a memory command.

In one embodiment, the apparatus 402 for monitoring memory addresses may be an apparatus that is included in an MCU (not shown) related to memory control, or an apparatus that is separate from the MCU and operates in conjunction with the MCU. Furthermore, the peripheral devices 412, 414, 416 and 418 may be devices that are included in an MCU related to memory control.

Meanwhile, the path conversion unit 404 connects the address path 408 to the DQ pin 422 in response to a path decision signal generated by the path decision signal generation unit 406. Furthermore, when the address path 408 is connected to the DQ pin 422, the path conversion unit 404 transmits memory addresses, corresponding to a memory command, to the DQ pin 422 so that the memory addresses are monitored through the DQ pin 422.

When the address path 408 is not connected to the DQ pin 422, the path conversion unit 404 connects the data path 410 to the DQ pin 422 so that memory data can be transmitted or received through the data path 410. Here, the memory data may include write memory data transmitted to the memory or read memory data transmitted from the memory.

When write memory data is transmitted along the data path 410 or read memory data is received from the DQ pin 422, the path conversion unit 404 disconnects the address path 408 and the DQ pin 422 from each other.

This is used, in the case where write memory data or read memory data must be transmitted while a memory address is transmitted to the DQ pin 422 in order to monitor the memory address, to give priority to the memory data over the memory address and prevent the memory address and the memory data from colliding with each other at the DQ pin 422. A method of preventing such collision will be described in detail later.

Figure 5:
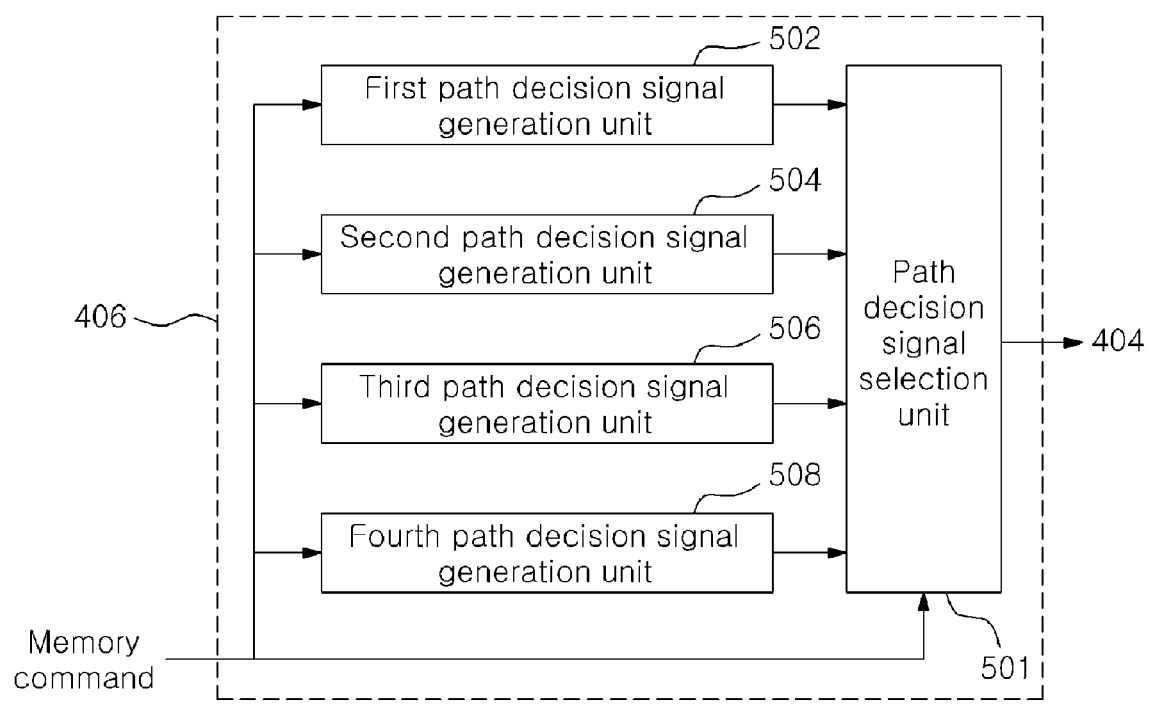
FIG. 5 is a block diagram showing a path decision signal generation unit according to an embodiment of the present invention.

FIG. 5 is a block diagram showing a path decision signal generation unit 406 according to an embodiment of the present invention. The path decision signal generation unit 406 includes a path decision signal selection unit 501, a first path decision signal generation unit 502, a second path decision signal generation unit 504, a third path decision signal generation unit 506, and a fourth path decision signal generation unit 508.

The path decision signal generation unit 406 generates a path decision signal for determining whether to connect the address path 408 to the DQ pin 422 according to a memory command in order to monitor memory addresses.

The path decision signal selection unit 501 selects any one from among path decision signals, generated by the first path decision signal generation unit 502, the second path decision signal generation unit 504, the third path decision signal generation unit 506 and the fourth path decision signal generation unit 508, according to a memory command, and transmits the selected path decision signal to the path conversion unit 404. Here, the memory command may be any one of a write data transfer command, a write command, and a read command according to CL.

When the memory command is a write command or write data transfer command, the first path decision signal generation unit 502 generates the path decision signal for enabling the DQ pin 422 to connect to the data path 410 so that write memory data is transmitted from the data path 410 to the DQ pin 422.

The path decision signal generated by the first path decision signal generation unit 502 enables the path conversion unit 404 to connect the DQ pin 422 to the data path 410 when the MCU transmits write memory data, corresponding to the write command, to the memory. Accordingly, the write memory data is transmitted to the memory according to memory operation standards.

When the memory command is a write command, the second path decision signal generation unit 504 generates a path decision signal for connecting the DQ pin 422 to the address path 408 so that an memory address for write memory data is transmitted to the DQ pin 422 along the address path 408.

The path decision signal generated by the second path decision signal generation unit 504 enables the path conversion unit 404 to connect the DQ pin 422 to the address path 408 one clock cycle earlier than a cycle in which the write memory data corresponding to the write command is transmitted. Here, one cycle refers to one memory clock cycle.

Figure 6:
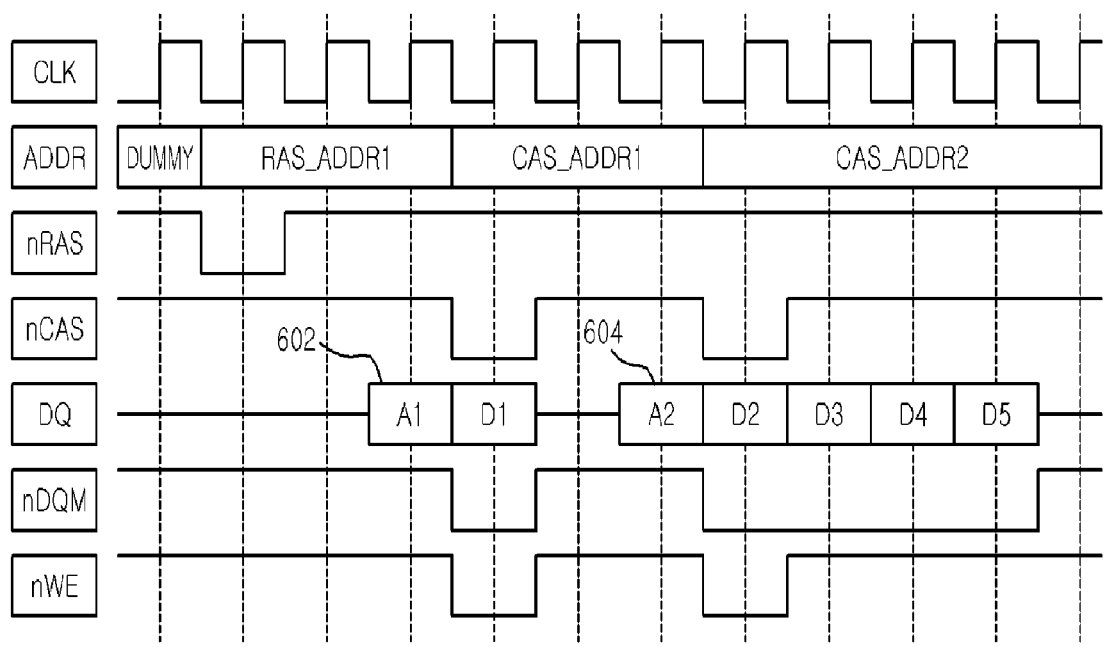
FIG. 6 is a timing diagram of signals for a memory write operation in a monitoring method according to an embodiment of the present invention.

FIG. 6 is a timing diagram of signals for a memory write operation in a monitoring method according to an embodiment of the present invention.

In a memory module using SDRAN as a memory, the number of pins required for the transmission of memory addresses is not generally larger than that required for the transmission of memory data. For example, a total of 64 DQ pins exist in a memory module in which eight memory chips of 64 Mbits, each having eight DQ pins, are mounted, and is larger than 15, which is the number of address pins of a memory module.

On the basis of this, when a memory address value is transmitted to the DQ pin 422 of the memory, a chip user can easily find an actual memory address, which is used by the MCU, by checking the value of the DQ pin 422.

Referring to FIG. 6, in a connection portion between the memory and the MCU, CLK denotes a clock, ADDR denotes a row or column address, nRAS denotes the inverted value of a Row Address Strobe (RAS) signal, and nCAS denotes the inverted value of a CAS signal. DQ denotes memory data, nDQM denotes the inverted value of a DQ Mask (DQM) signal, and nWE denotes the inverted value of a Write Enable (WE) signal.

In the case where an actual memory address is indicated in the DQ pin 422, the actual memory address must not influence actual chip and memory operations, but must allow a user to easily find the actual memory address. To this end, in the write operation of FIG. 6, the path decision signal generated by the second path decision signal generation unit 504 enables each of actual memory addresses A1 and A2 to be transmitted to the DQ pin 422 during one cycle that is one cycle earilier than a cycle in which the nCAS signal is at a low voltage level.

That is, a corresponding path decision signal enables the path conversion unit 404 to connect the DQ pin 422 to the address path 408 and to transmit the memory address A1 602 or A2 604 to the DQ pin 422 during one memory clock cycle that is one memory clock cycle earlier than a cycle in which write memory data is transmitted to the memory.

Consequently, a user can easily find a memory address and a data value from a signal monitored through the DQ pin 422 without influencing actual chip and memory operations.

Figure 7A:
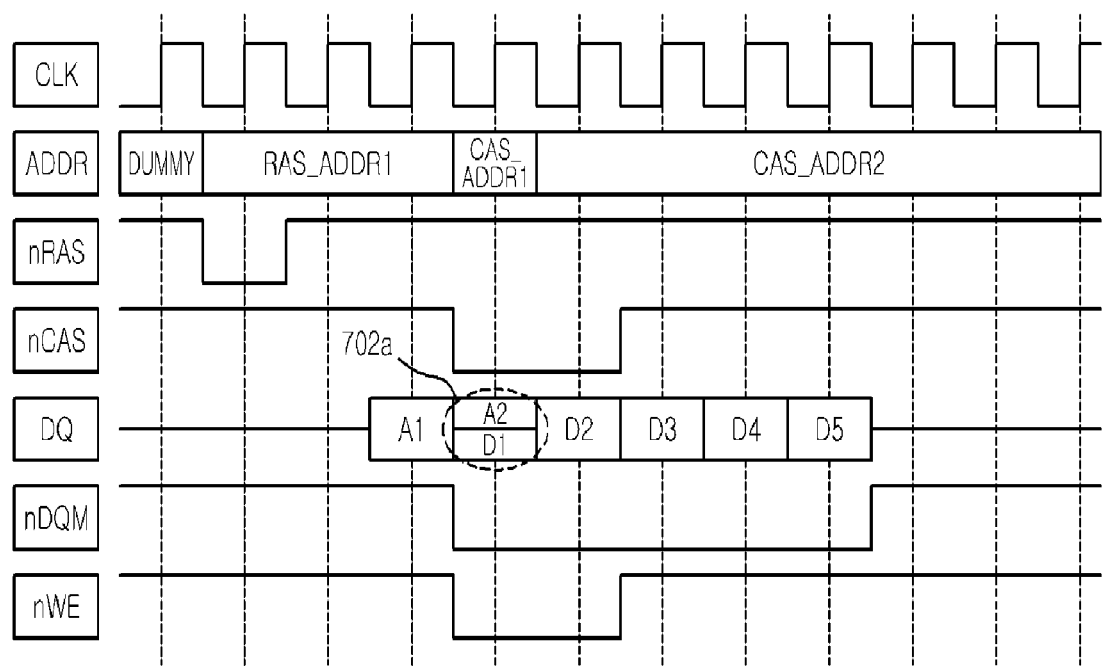
FIG. 7A is a diagram showing that collision is generated at a DQ pin between a memory address and memory data because different column addresses are generated consecutively.

FIG. 7A is a diagram showing that a memory address and memory data collide with each other at the DQ pin 422 because different column addresses are consecutively generated.

It is assumed that a path decision signal generated by the second path decision signal generation unit 504 enables the path conversion unit 404 to transmit each of actual memory addresses A1 and A2 during one cycle that is one cycle earlier than a cycle in which the nCAS signal is at a low voltage level, and different column addresses are consecutively generated.

As shown in this drawing, if column addresses CAS_ADDR1 and CAS_ADDR2 are consecutively generated and the nCAS signal is constantly at a low voltage level during two cycles, the memory address A2 and memory data D1 are transmitted to the DQ pin 422 at the same time and collide with each other (702a).

This shows the case where the transmission of memory addresses for monitoring is erroneously performed according to the present invention. In order to solve this problem, in the case where memory data and memory addresses are transmitted at the same time, a method of giving priority to the memory data is used.

That is, if write memory data is transmitted along the data path 410 or read memory data is received from the DQ pin 422, the path conversion unit 404 disconnects the address path 408 and the DQ pin 422 from each other. Furthermore, in order to transmit or receive memory data to or from the memory, the DQ pin 422 is connected to the data path 410.

Figure 7B:
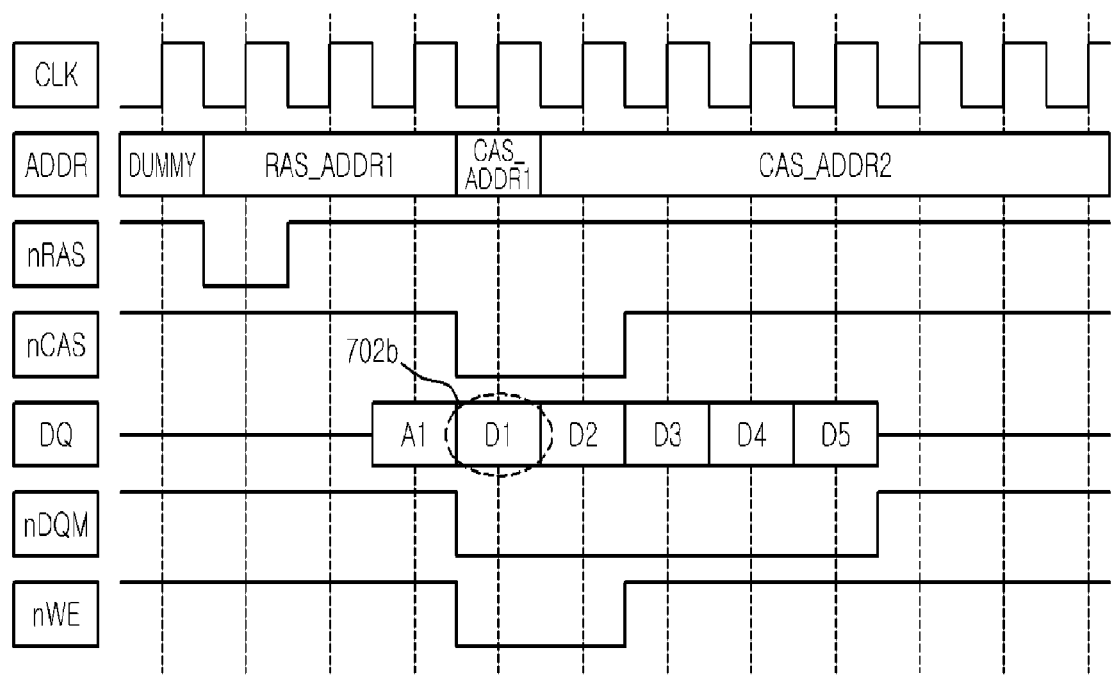
FIG. 7B is a diagram showing that, in the case where different column addresses are generated consecutively, priority is given to memory data and only the memory data is transmitted to a DQ pin.

FIG. 7B is a diagram showing that, in the case where different column addresses are consecutively generated, priority is given to memory data and only the memory data is transmitted to the DQ pin 422.

Referring to FIG. 7B, it can be seen that only the memory data D1 having priority is transmitted to the DQ pin 422 during a time interval 702b, which was the collision interval 702a in FIG. 7A.

However, consecutive write operations are rarely performed because memory executes commands in pipeline form and a next command is generated after one command is executed. In the case where consecutive write operations must be performed, a collision problem can be solved by giving priority to memory data over a memory address.

Referring back to FIG. 5, if a memory command under consideration is a CL2 (CAS Latency=2) read command, the third path decision signal generation unit 506 generates a path decision signal for connecting the DQ pin 422 to the address path 408 so that a memory address for read memory data is transmitted to the DQ pin 422 along the address path 408.

The path decision signal generated by the third path decision signal generation unit 506 enables the path conversion unit 404 to connect the DQ pin 422 to the address path 408 one cycle earlier than a cycle in which the read memory data corresponding to the CL2 read command is received.

If the memory command is a CL3 (CAS Latency=3) read command, the fourth path decision signal generation unit 508 generates a path decision signal for connecting the DQ pin 422 to address path 408 so that a memory address for read memory data is transmitted to the DQ pin 422 along the address path 408.

The path decision signal generated by the fourth path decision signal generation unit 508 enables the path conversion unit 404 to connect the DQ pin 422 to the address path 408 one cycle earlier than a cycle in which the read memory data corresponding to the CL3 read command is received.

Figure 8:
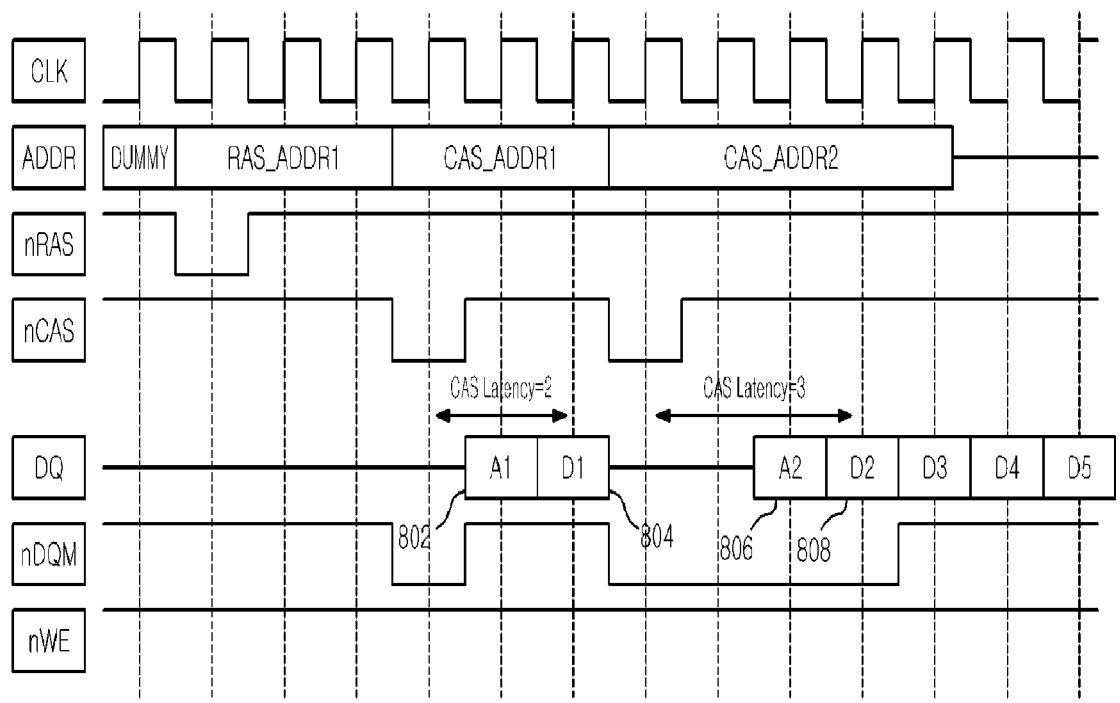
FIG. 8 is a timing diagram of signals for a memory read operation in the monitoring method according to an embodiment of the present invention.

FIG. 8 is a timing diagram of signals for a memory read operation in the monitoring method according to an embodiment of the present invention.

Referring to FIG. 8, a path decision signal generated by the third path decision signal generation unit 506 enables an actual memory address A1 802 to be transmitted to the DQ pin 422 during one cycle that is one cycle later than a cycle in which an nCAS signal is at a low voltage level, that is, one cycle earlier than a cycle in which read data memory D1 804 is received from the memory.

Accordingly, in response to the corresponding path decision signal, the path conversion unit 404 connects the DQ pin 422 to the address path 408 and transmits the memory address A1 802 to the DQ pin 422 during one memory clock cycle that is one memory clock cycle earlier than a cycle in which the read data memory D1 804 is received from the memory.

Furthermore, a path decision signal generated by the fourth path decision signal generation unit 508 enables an actual memory address A2 806 to be transmitted to the DQ pin 422 during one cycle that is two cycles later than an interval in which the nCAS signal is at a low voltage level, that is, one cycle earlier than a cycle in which a read memory data D2 808 is received from the memory.

Accordingly, in response to the corresponding path decision signal, the path conversion unit 404 connects the DQ pin 422 to the address path 408 and transmits the memory address A2 806 to the DQ pin 422 during one memory clock cycle that is one memory clock cycle earlier than a cycle in which the read data memory D2 808 is received from the memory.

As described above, the points of time at which the memory addresses A1 802 and A2 806 are transmitted are changed according to CL. Furthermore, as in the write operation, each of the respective memory addresses A1 802 and A2 806 is transmitted one cycle earlier than a cycle in which each of the memory data D1 804 and memory data D2 808 is transmitted, so that a user can conveniently monitor the memory addresses A1 802 and A2 806.

Furthermore, in the case where a memory read operation is performed, a write or read operation does not start before the memory read operation is completed. Accordingly, since another command is not transmitted immediately after a read command, a collision such as that shown in FIG. 7A does not occur.

Figure 9:
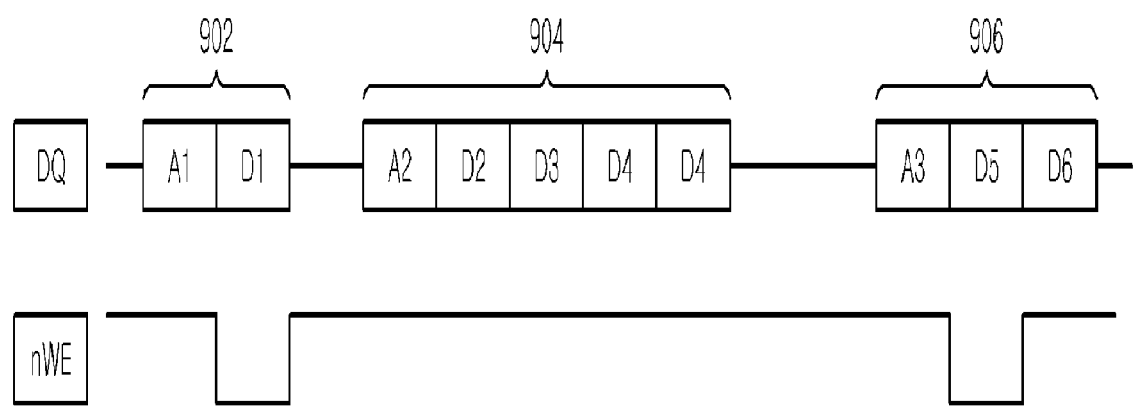
FIG. 9 shows the sequence of a DQ signal and the timing diagram of an nWE signal according to an embodiment of the present invention.

FIG. 9 shows a sequence of the DQ signal and is a timing diagram of an nWE signal according to an embodiment of the present invention.

As shown in this drawing, the path decision signal generation unit 406 generates a path decision signal according to a memory command so that, during time intervals in which the nWE signal is at a high voltage level, the first DQ signal of DQ signal sequences 902, 904, and 906 of memory becomes the memory address. Here, the path decision signal is generated by the first path decision signal generation unit 502, the second path decision signal generation unit 504, the third path decision signal generation unit 506 or the fourth path decision signal generation unit 508 according to the memory command, and is selected by the path decision signal selection unit 501.

Accordingly, a user can check an SDRAM operation only using the DQ signal and the nWE signal, as shown in FIG. 9, without checking all signals used in the SDRAM. That is, it can be seen that, in the case where the nWE signal is at a low voltage level, an SDRAM operation corresponds to a write operation, and in the case where the nWE signal is in a level other than the low voltage level, an SDRAM operation corresponds to a read operation. Furthermore, since it can be easily found that the first DQ signal of the DQ signal sequences 902, 904, and 906 is a memory address and values subsequent to the first DQ signal are memory data, a memory address corresponding to a memory command can be monitored easily.

Figure 10:
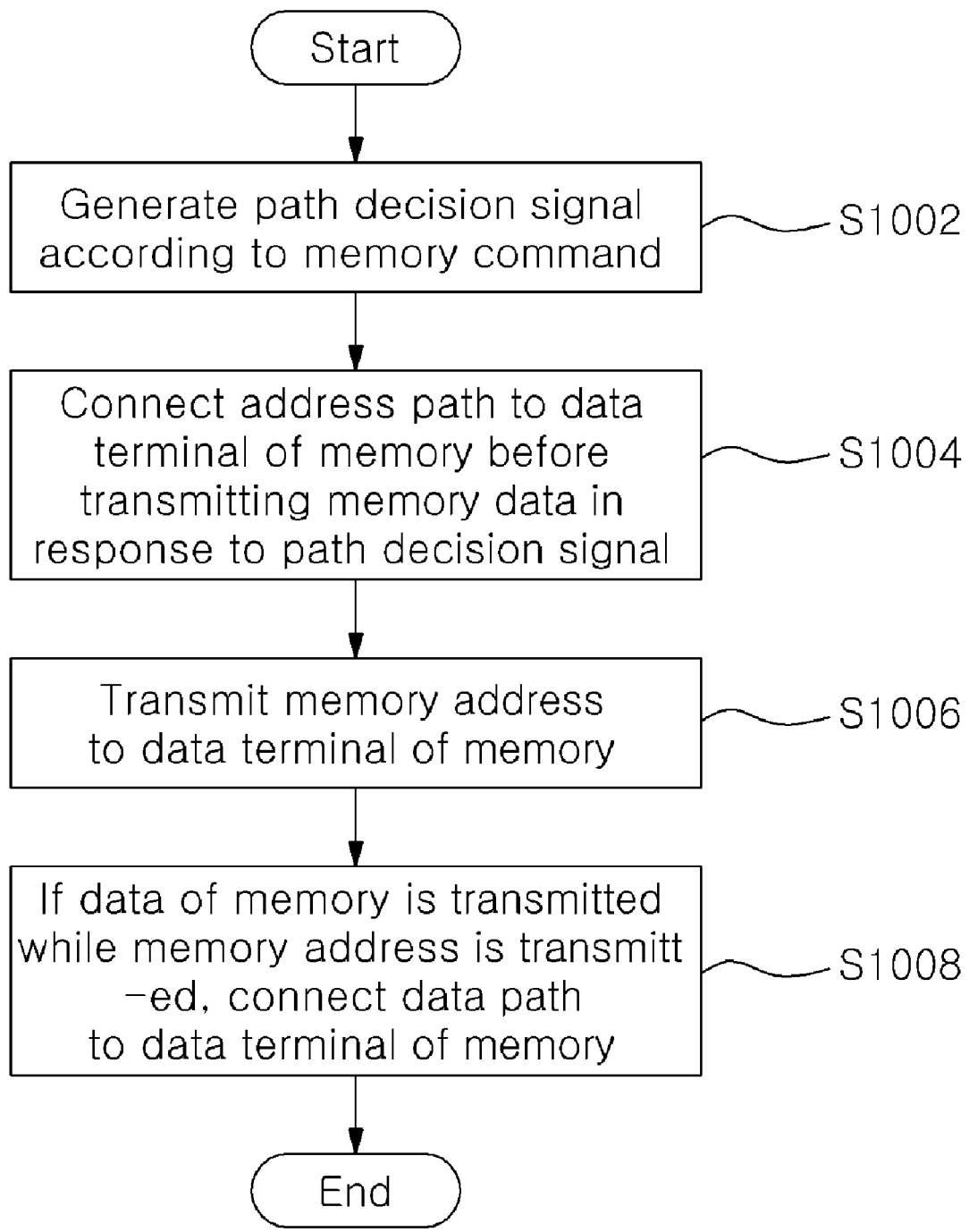
FIG. 10 is a flowchart showing a method of monitoring memory addresses according to an embodiment of the present invention.

FIG. 10 is a flowchart showing a method of monitoring memory addresses according to an embodiment of the present invention.

First, a path decision signal for determining whether to connect the address path to the data terminal of the memory is generated according to a memory command at step S1002.

Here, a memory address, which is converted into a row or column address of the memory, is transmitted along the address path.

In one embodiment, the memory command may be any one of a write data transfer command, a write command, and a read command according to CL.

After the path decision signal is generated, the address path is connected to the data terminal of the memory before the transmission of memory data in response to the path decision signal at step S1004.

After the address path is connected to the data terminal of the memory, a memory address corresponding to the memory command is transmitted to the data terminal of the memory so that the memory address is monitored through the data terminal of the memory at step S1006.

In one embodiment, the path decision signal may decide whether to connect the data terminal of the memory to the address path during one memory clock cycle that is one memory clock cycle earlier than a cycle in which memory data is transmitted or received.

In one embodiment, the path decision signal may decide whether to connect any one of the data path and the address path to the data terminal of the memory.

In one embodiment, a time interval in which the address path is connected to the data terminal of the memory in response to the path decision signal may vary depending on the CL of a read command.

In one embodiment, the path decision signal may decide whether to connect the address path to the data terminal of the memory so that the first DQ signal of the DQ signal sequences of the memory becomes the memory address during a time interval in which the nWE signal is at a high voltage level.

Thereafter, if the data of the memory is transmitted while the memory address is transmitted, the address path and the data terminal of the memory are disconnected from each other, and the data path is then connected to the data terminal of the memory at step S1008. Accordingly, during time intervals in which memory data must be transmitted, priority is given to the memory data over the memory address so that only the memory data is transmitted to the data terminal of the memory.

As described above, according to the present invention, a memory address is output to a data terminal of memory during a specific time interval according to a memory command. Accordingly, there is an advantage in that memory addresses can be measured and monitored directly even without a process of checking memory addresses mapped to row and column addresses.

Furthermore, according to the present invention, memory addresses are output to a memory data terminal. Accordingly, there is an advantage in that the addresses of memory can be monitored at low cost without the need for an additional measurement pin.

Although the preferred embodiments of the present invention have been disclosed for illustrative purposes, those skilled in the art will appreciate that various modifications, additions and substitutions are possible, without departing from the scope and spirit of the invention as disclosed in the accompanying claim.

What is claimed is:

1. A method of monitoring memory addresses, each of the memory addresses being transmitted along an address path and being converted into a row or column address of memory, the method comprising the steps of:
   generating a path decision signal for deciding whether to connect the address path to a data terminal of the memory according to a memory command; and
   when the address path is connected to the data terminal of the memory in response to the path decision signal, transmitting a memory address, corresponding to the memory command, to the data terminal of the memory so that the memory address is monitored through the data terminal of the memory.

2. The method as set forth in claim 1, wherein the path decision signal decides to connect the address path to the data terminal of the memory before memory data corresponding to the memory command is transmitted to the memory or the memory data is received from the memory.

3. The method as set forth in claim 2, wherein the path decision signal decides to connect the data terminal of the memory to the address path during one memory clock cycle that is one memory clock cycle earlier than a cycle in which the memory data is transmitted or received.

4. The method as set forth in claim 1, wherein the path decision signal decides whether to connect any one of a data path and the address path to the data terminal of the memory.

5. The method as set forth in claim 1, wherein the memory command is any one of a write data transfer command, a write command and a read command according to Column Address Strobe (CAS) Latency (CL).

6. The method as set forth in claim 5, wherein the path decision signal decides a time interval during which the address path is connected to the data terminal of the memory according to the CL.

7. The method as set forth in claim 1, further comprising the step of, when write memory data is transmitted along a data path or read memory data is received from the data terminal of the memory, and the address path and the data terminal of the memory are connected to each other, releasing the connection and connecting the data path to the data terminal of the memory.

8. The method as set forth in claim 1, wherein the path decision signal decides whether to connect the address path to the data terminal of the memory so that a first DQ signal of DQ signal sequences of the memory becomes the memory address during time intervals in which an nWE signal is at a high voltage level.

9. An apparatus for monitoring memory addresses, each of the memory addresses being transmitted along an address path and being converted into a row or column address of memory, the apparatus comprising:
   a path decision signal generation unit for generating a path decision signal for deciding whether to connect the address path to a data terminal of the memory according to a memory command; and
   a path conversion unit for connecting the address path to the data terminal of the memory in response to the path decision signal, and transmitting a memory address, corresponding to the memory command, to the data terminal of the memory so that the memory address is monitored through the data terminal of the memory.

10. The apparatus as set forth in claim 9, wherein the path decision signal generation unit generates the path decision signal for enabling the address path to connect to the data terminal of the memory before memory data corresponding to the memory command is transmitted to the memory or the memory data is received from the memory.

11. The apparatus as set forth in claim 10, wherein the path decision signal generation unit generates the path decision signal for enabling the data terminal of the memory to connect to the address path during one memory clock cycle that is one memory clock cycle earlier than a cycle in which the memory data is transmitted or received.

12. The apparatus as set forth in claim 9, wherein the path decision signal decides whether to connect any one of a data path and the address path to the data terminal of the memory.

13. The apparatus as set forth in claim 9, wherein the memory command is any one of a write data transfer command, a write command, and a read command according to CL.

14. The apparatus as set forth in claim 13, wherein the path decision signal decides a time interval in which the address path is connected to the data terminal of the memory according to the CL.

15. The apparatus as set forth in claim 9, wherein the path conversion unit, in the case where write memory data is transmitted along a data path or read memory data is received from the data terminal of the memory, and the address path and the data terminal of the memory are connected to each other, disconnects the address path and the data terminal of the memory from each other and connects the data path to the data terminal of the memory.

16. The apparatus as set forth in claim 9, wherein the path decision signal generation unit generates the path decision signal for deciding whether to connect the address path to the data terminal of the memory so that a first DQ signal of DQ signal sequences of the memory becomes the memory address during time intervals in which an nWE signal is at a high voltage level.

* * * * *